(12) United States Patent
Wei et al.

(10) Patent No.: US 11,830,816 B2
(45) Date of Patent: Nov. 28, 2023

(54) REDUCED RESISTIVITY FOR ACCESS LINES IN A MEMORY ARRAY

(71) Applicant: Micron Technology, Inc., Boise, ID (US)

(72) Inventors: Lei Wei, Boise, ID (US); Adam Thomas Barton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 149 days.

(21) Appl. No.: 16/993,695

(22) Filed: Aug. 14, 2020

(65) Prior Publication Data

US 2022/0051984 A1     Feb. 17, 2022

(51) Int. Cl.
*H01L 23/538*   (2006.01)
*G11C 5/06*     (2006.01)
*H01L 21/768*   (2006.01)
*G11C 7/10*     (2006.01)

(52) U.S. Cl.
CPC ............ *H01L 23/5384* (2013.01); *G11C 5/06* (2013.01); *G11C 7/1078* (2013.01); *H01L 21/76802* (2013.01); *H01L 21/76877* (2013.01); *H01L 23/5386* (2013.01)

(58) Field of Classification Search
CPC ............ H01L 23/5283; H01L 23/5384; H01L 21/76802; H01L 21/76877; G11C 5/06; G11C 7/1078
See application file for complete search history.

(56) References Cited

U.S. PATENT DOCUMENTS

| | | | |
|---|---|---|---|
| 8,054,674 B2* | 11/2011 | Tamai | G11C 11/5685 365/158 |
| 10,096,612 B2* | 10/2018 | Vegunta | H01L 27/11582 |
| 2006/0252252 A1* | 11/2006 | Zhu | H01L 21/02074 257/E21.174 |
| 2018/0261651 A1* | 9/2018 | Hirayama | G11C 13/0069 |
| 2019/0035851 A1* | 1/2019 | Tortorelli | H01L 45/1253 |
| 2020/0350225 A1* | 11/2020 | Economy | H01L 21/02186 |
| 2020/0402988 A1* | 12/2020 | Howder | H01L 27/11519 |
| 2021/0225937 A1* | 7/2021 | Economy | H01L 23/53266 |
| 2021/0305506 A1* | 9/2021 | Albini | H01L 27/2463 |

* cited by examiner

*Primary Examiner* — Dale E Page
*Assistant Examiner* — John M Parker
(74) *Attorney, Agent, or Firm* — Holland & Hart LLP

(57) ABSTRACT

Methods, systems, and devices for reduced resistivity for access lines in a memory array are described. A first metal layer may be formed above a via that is configured to couple an access line of a memory array with a corresponding driver. The first metal layer may be oxidized, and then a second metal layer may be formed above the oxidized first metal layer. One or more access lines of the memory device may be formed from the second metal layer, the oxidized first metal layer, or both.

10 Claims, 7 Drawing Sheets

REDUCED RESISTIVITY FOR ACCESS LINES IN A MEMORY ARRAY

BACKGROUND

The following relates generally to one or more systems for memory and more specifically to reduced resistivity for access lines in a memory array.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
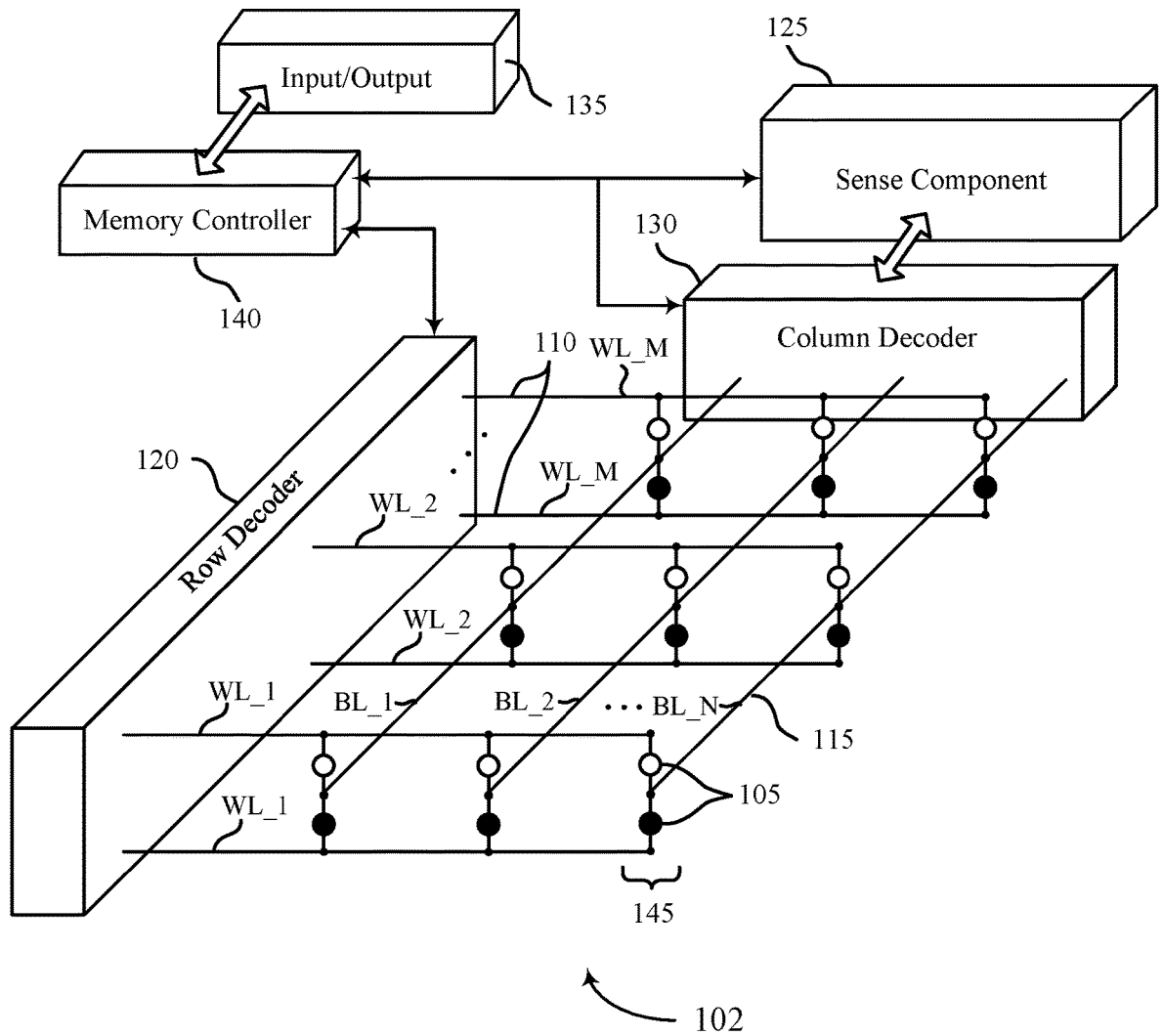
FIG. 1 illustrates an example of a memory device that supports reduced resistivity for access lines in a memory array in accordance with examples as disclosed herein.

Accessing (e.g., reading or writing) a memory cell in a memory array may include applying a non-zero voltage to one or more access lines coupled with the memory cell. Over the course of operating a memory array, charge may be accumulated within parasitic capacitances of the memory array (e.g., parasitic capacitances associated with the access lines of the memory array). In some examples, the accumulated charge may discharge through an accessed memory and result in a current "spike" (e.g., a relatively high current discharge through the memory cell in a relatively short time period). For example, the memory cell may become conductive when accessed (e.g., when a voltage across the memory cell exceeds a threshold voltage of the memory cell), which may cause accumulated charge within the memory array to discharge through the selected memory cell. A current spike may cause damage to the memory cell. For example, the memory cell may be degraded or worn out in proportion to the number and magnitude of current spikes experienced by the memory cell over time.

In some memory arrays, each access line may be coupled with a corresponding driver, which may be configured to bias the access line at a desired voltage. An access line may be coupled with the corresponding driver by one or more vias (or other interconnects), with the drivers located outside (e.g., underneath) the memory array. The distance of the current path between a memory cell and the driver of an access line coupled with the memory cell may be referred to as the electrical distance (ED) for the memory cell, at least in the context of that access line or driver.

Memory cells near where an access line is connected with a via may have a relatively small ED and be referred to as near memory cells, and memory cells far from where the access line is connected with the via may have a relatively large ED and be referred to as far memory cells. In some examples, accessing far memory cells may demand a relatively large amount of drive current due to a relatively high resistance between the driver and the memory cell. In other examples, near memory cells may experience more severe (e.g., more damaging) current spikes due to a relatively low resistance path between the memory cell and the charge built up in parasitic capacitances along the entire length of the access line. Thus, optimizing drive currents for access line drivers, resistivities of access lines, or other aspects of a memory arrays physical or operating parameters may involve a tradeoff related to the difference in ED between far memory cells and near memory cells.

Techniques and structure as described herein may mitigate current spikes and reduce access line resistivity (and thus the difference in ED between far memory cells and near memory cells), among other benefits that may be appreciated by one of ordinary skill in the art. A first metal layer may be formed above a stack of one or more materials, where vias extend through the stack, and where each via may be coupled with a respective driver. Thus, the first metal layer may be formed above and in contact with an exposed upper surface of each of the vias. The first metal layer may be formed as a relatively thin layer (e.g., as a lamellae). The first metal layer may then be oxidized. In some cases, an entire depth of the first metal layer may be oxidized. And in some cases, the via may be formed of metal, and an upper portion of the via may also become oxidized. A second metal layer may then be formed above the oxidized first metal layer. The second metal layer may be thicker than the oxidized first metal layer. The oxidized first metal layer and the second metal layer may be patterned to form a set of access lines, each access line coupled with a corresponding via and thus a corresponding driver.

The metal oxide if oxidized first metal layer (and potentially of the upper portion of the via as well) may introduce resistance into the signal path between the driver for an access line and memory cells coupled with the access line, which may reduce current spikes for near memory cells. Additionally, forming the second metal layer above the metal oxide (e.g., the oxidized first metal layer) may result in a reduced resistivity of the second metal layer, and thus the resultant access lines. This may decrease power consumption and also reduce relative differences in ED for near memory cells versus far memory, which may support improved or simplified optimization of drive currents for the memory array or other operational or physical features of the memory array or of a device or system that includes the memory array.

Features of the disclosure are initially described in the context of devices and arrays as described with reference to FIGS. 1 and 2. Features of the disclosure are described in the context of memory structures as described with reference to FIGS. 3-5. These and other features of the disclosure are further illustrated by and described with reference to an apparatus diagram and flowcharts that relate to reduced resistivity for access lines in a memory array as described with reference to FIGS. 7 and 8.

FIG. 1 illustrates an example memory device 100 in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and not necessarily actual physical positions within the memory device 100. Further, although some elements included in FIG. 1 are labeled with a numeric indicator, other corresponding elements are not labeled though they are the same or would be understood to be similar, in an effort to increase visibility and clarity of the depicted features.

In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1, and thus to store one bit of information. In some examples, a memory cell 105 may be configured to store one of more than two logic states, and thus to store more than one bit of information.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two decks (levels) of memory cells 105 and may thus be considered a 3D memory array; however, the number of decks is not limited to two and may in some cases be one or more than two. Each deck may be aligned or positioned so that memory cells 105 within one deck may be aligned (exactly, overlapping, or approximately) with memory cells of another deck, forming memory cell stacks 145.

A memory cell 105 may, in some examples, be a self-selecting memory cell, a phase change memory (PCM) cell, and/or another type of resistive or threshold-based memory cell. A self-selecting memory cell 105 may include one or more components of a material (e.g., a chalcogenide material) that each function both as a storage element and as a cell selector (selection) element, thereby eliminating the need for separate cell selector circuitry (a selector circuitry that does not contribute to storage). Such an element may be referred to as a storage and selector component (or element), or as a self-selecting memory component (or element). In contrast, other types of memory cells, such as dynamic random access memory (DRAM) or PCM cells, may each include a separate (dedicated) cell selector element such as a three-terminal selector element (e.g., a transistor) or two-terminal selector element (e.g., a diode) to contribute to the selection or non-selection of the memory cell without contributing to the storage of any logic state.

Memory array 102 may include multiple word lines 110 (e.g., row lines) for each deck, labeled WL_1 through WL_M, and multiple bit lines 115 (e.g., column lines), labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may generically be referred to as access lines because they may permit access to memory cells 105. In some examples, word lines 110 may also be known as row lines 110, and bit lines 115 may also be known as digit lines 115 or column lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively doped semiconductors, or other conductive materials, alloys, compounds, or the like.

Word lines 110 and bit lines 115 may be substantially perpendicular (i.e., orthogonal) to one another or otherwise intersect one another to create an array of memory cells. As shown in FIG. 1, the two memory cells 105 in a memory cell stack 145 may share a common conductive line, such as a bit line 115. That is, a bit line 115 may be in electronic communication with the bottom electrode of the upper memory cell 105 and the top electrode of the lower memory cell 105 of the memory cell stack 145. Other configurations may be possible, for example, a third deck (not shown) may share an access line 110 with the lower illustrated deck or the upper illustrated deck. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read, write, or otherwise access a memory cell 105 at their intersection. Other memory cells 105 that are in electronic communication with (e.g., connected to) the same word line 110 or bit line 115 may be referred to as untargeted memory cells 105.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting or other memory components (e.g., a selection component and a storage component) separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

The electrodes within a memory cell stack 145 may each be of a same material (e.g., carbon) or may be of various (different) materials. In some cases, the electrodes may be a different material than the access lines. In some examples, the electrodes may shield a material (e.g., a chalcogenide material) included in a self-selecting or other memory component from the word line 110, from the bit line 115, and from each other to prevent chemical interaction between the material and the word line 110, the bit line 115, or another memory component.

Operations such as reading and writing may be performed on memory cells 105 by activating or selecting (e.g., changing the voltage of) a corresponding word line 110 or bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example.

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in signals obtained based on reading a memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. A person of ordinary skill in the art will appreciate that sense component may be associated either with column decoder or row decoder without losing its functional purpose.

Though illustrated to the side of the memory array 102 for clarity, the row decoder 120 and column decoder 130 may in some cases be below the memory array 102. Each decoder 120, 130 may include or be coupled with one or more drivers configured to drive the access lines 110, 115 to desired voltages (e.g., to access one or more associated memory cells 105). In some cases, the drivers may be distributed throughout an area under the memory array 102. Vias may extend through one or more layers or decks of the memory device 100 to couple the drivers with their corresponding access lines 110, 115. For example, if the access lines 110, 115 are considered to extend in horizontal directions (e.g., an x direction or a y direction), vias may extend in a vertical (z) direction. In some cases, one or more layers between the drivers and the access lines may include metal routing lines, which may be referred to as interconnect layers or collectively as an interconnect layer. Drivers may be coupled with corresponding lines in the interconnect layer and vias may extend between the interconnect layer and the layers that include the access lines 115.

As described herein, a portion (e.g., a lower portion) of a word line 110 or bit line 115 may include a line of metal oxide that is in contact with a via for the word line 110 or bit line 115. The line of metal oxide may be conceptualized as part of the word line 110 or bit line 115 or as separate from the word line 110 or bit line 115—the scope of the claims does not depend on such conceptualizations. An upper portion of the via may also be oxidized. As discussed elsewhere, the metal oxide may reduce the severity of current spikes experienced by memory cells coupled with the word line 110 or bit line 115. Additionally or alternatively, the word line 110 or bit line 115 may have a reduced resistivity due to the presence of the metal oxide (e.g., a metal layer formed above the metal oxide and from which the word line 110 or bit line 115 is formed may have a lower resistivity than were such metal layer formed in the absence of the metal oxide).

Figure 2:
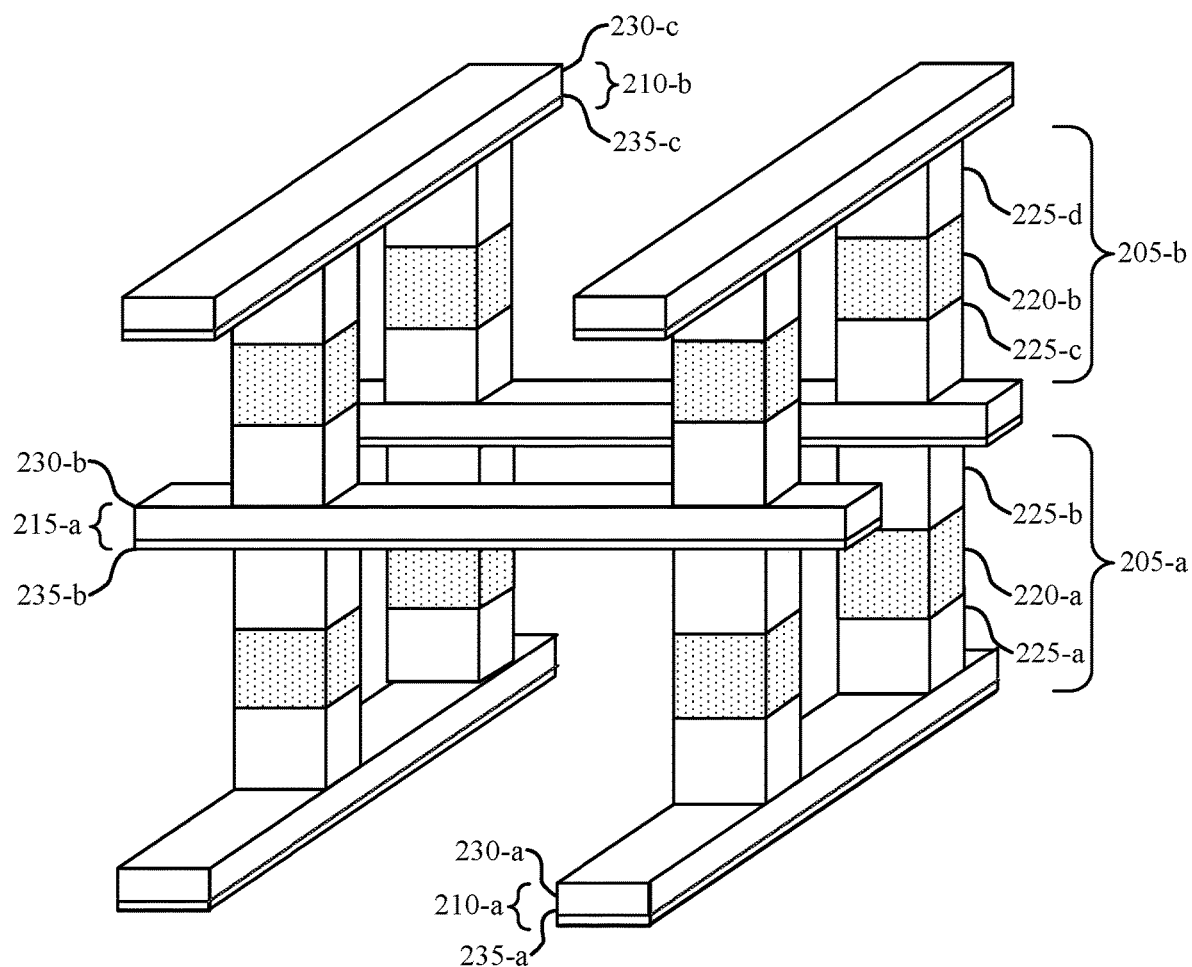
FIG. 2 illustrates an example of a memory array that supports reduced resistivity for access lines in a memory array in accordance with examples as disclosed herein.
Figure 2:
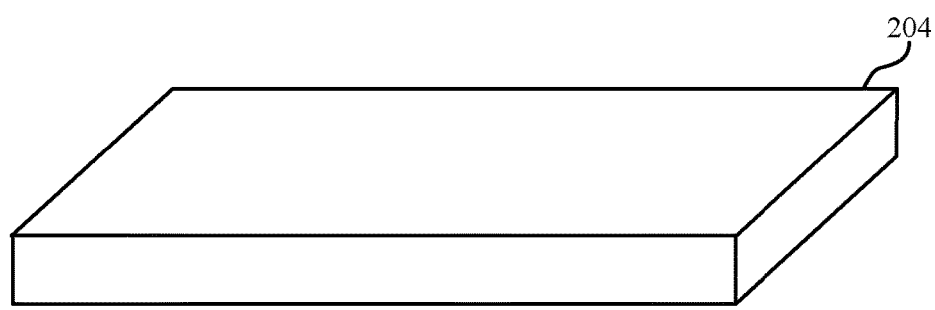

FIG. 2 illustrates an example of a 3D memory array 200 in accordance with examples as disclosed herein. The memory array 200 may be an example of portions of a memory array 102 described with reference to FIG. 1. The memory array 200 may include a first array or deck 205-a of memory cells that is positioned above a substrate 204 and second array or deck 205-b of memory cells that is positioned above the first array or deck 205-a. Though the example of the memory array 200 includes two decks 205-a, 205-b, it is to be understood that one deck 205 (e.g., a 2D memory array) or more than two decks 205 are also possible. Further, although some elements included in FIG. 2 are labeled with a numeric indicator, other corresponding elements are not labeled though they are the same or would be understood to be similar, in an effort to increase visibility and clarity of the depicted features.

The memory array 200 may also include word lines 210 and bit lines 215, which may be examples of word lines 110 and bit lines 115 as described with reference to FIG. 1. The word lines 210 and bit lines 215 may have been initially formed (fabricated) from one or more corresponding layers or metal or metal oxide, and thus may comprise a metal material such as tungsten (W), copper (Cu), aluminum (Al), gold (Au), titanium (Ti), or a metal alloy.

In some cases, the resistivity of an access line may be expressed as an amount of electrical resistance per unit of length of the access line (e.g., resistivity may in some cases be expressed in units of ohm meters—ohms per meter length multiplied by the cross-sectional area of the access line as expressed in square meters—resulting in a fixed amount of electrical resistance per unit of length of the access line if the cross-sectional area of the access line is constant). Additionally or alternatively, the resistivity of an access line or may be expressed as a sheet resistance, which may be a measure of resistivity of materials comprising or formed from sheets of material having a uniform thickness. In some cases, a sheet resistance may be expressed in units of ohms square, which may be dimensionally equal to an ohm (e.g., as a result of dividing the resistivity unit of ohm meter by the uniform sheet thickness as expressed in meters) but may specifically connote sheet resistance (e.g., rather than bulk resistance, such as of a conventional resistor).

Memory cells of the first deck 205-a may include first electrode 225-a, a memory element 220-a, and a second electrode 225-*b*. In addition, memory cells of the second deck 205-*b* may include a first electrode 225-*c*, a memory element 220-*b*, and a second electrode 225-*d*. The memory cells of the first deck 205-*a* and second deck 205-*b* may, in some examples, have common conductive lines such that corresponding memory cells of each deck 205-*a* and 205-*b* may share bit lines 215 or word lines 210 as described with reference to FIG. 1. For example, first electrode 225-*c* of the second deck 205-*b* and the second electrode 225-*b* of the first deck 205-*a* may be coupled to bit line 215-*a* such that bit line 215-*a* is shared by vertically adjacent memory cells.

The architecture of memory array 200 may in some cases be referred to as a cross-point architecture, in which a memory cell is formed at a topological cross-point between a word line 210 and a bit line 215 as illustrated in FIG. 2. Such a cross-point architecture may offer relatively high-density data storage with lower production costs compared to at least some other memory architectures. For example, the cross-point architecture may have memory cells with a reduced area and, resultantly, an increased memory cell density compared to at least some other architectures.

Though one memory element 220 per memory cell is shown for the sake of clarity, memory cells of the first deck 205-*a* and the second deck 205-*b* may each include one or more memory elements 220 (e.g., elements comprising a memory material configurable to store information), which may or may not be self-selecting memory elements. In some examples, a memory element 220 may, for example, comprise a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, a memory element 220 may be included in a PCM cell. Within a PCM cell, a memory element 220 may be switched from amorphous to crystalline and vice versa, and thus a state may be written to the memory cell that includes the memory element 220 by applying a voltage across and thus passing current through the memory element 220 so as to heat the memory element 220 beyond a melting temperature, and then removing the voltage and current according to various timing parameters configured to render the memory element 220 in the desired state (e.g., amorphous or crystalline). Heating and quenching of the memory element 220 may be accomplished by controlling current flow through the memory element 220, which in turn may be accomplished by controlling the voltage differential between the corresponding word line 210 and corresponding bit line 215.

A memory element 220 in the crystalline state may have atoms arranged in a periodic structure, which may result in a relatively low electrical resistance (e.g., set state). By contrast, a memory element 220 in an amorphous state may have no or relatively little periodic atomic structure, which may have a relatively high electrical resistance (e.g., reset state). The difference in resistance values between amorphous and crystalline states of the memory element 220 may be significant; for example, a material in an amorphous state may have a resistance one or more orders of magnitude greater than the resistance of the material in its crystalline state. In some cases, the amorphous state may have a threshold voltage associated with it and current may not flow until Vth is exceeded. Some PCM cells may include one memory element 220 configured to undergo phase changes and thereby act as a storage element and another memory element 220 configured to act as a diode (e.g., a snapback diode) and thus as a selection element. The selection element may be configured to remain in an amorphous state even when the storage element in the same PCM cell is placed into a crystalline state.

In some cases, a memory element 220 may be partially amorphous and partially crystalline, and the resistance may be of some value between the resistances of the memory element 220 in a wholly crystalline or wholly amorphous state. A memory element 220 thus may be used for other than binary logic applications—i.e., the number of possible states stored in a material may be more than two.

In some cases, a memory element 220 included in a self-selecting memory cell may be operated so as to not undergo a phase change during normal operation of the memory cell (e.g., due to the composition of the memory (e.g., chalcogenide) material, and/or due to operational voltages and currents configured to maintain the memory element 220 in a single phase, such as an amorphous or glass phase). For example, the memory element 220 may include a chemical element, such as arsenic, that inhibits crystallization of a chalcogenide material and thus may remain in an amorphous state. Here, some or all of the set of logic states supported by the memory cells (e.g., including memory element 220 and electrodes 225) may be associated with an amorphous state of the memory element 220 (e.g., stored by the memory element 220 while the memory element 220 is in the amorphous state). For example, a logic state '0' and a logic state '1' may both be associated with an amorphous state of the memory element 220 (e.g., stored by the memory element 220 while the memory element 220 is in the amorphous state). In some cases, memory element 220 may be configured to store a logic state corresponding to an information bit.

During a programming (write) operation of a memory cell (e.g., including electrodes 225-*a*, memory element 220-*a*, and electrode 225-*b*), the polarity used for programming (writing) or whether the memory element 220 is programmed into an amorphous or crystalline state may influence (determine, set, program) a particular behavior or characteristic of the memory element 220, such as the threshold voltage or resistance of the memory element 220. The difference in threshold voltages or resistances of the memory element 220 depending on the logic state stored by the memory element 220 (e.g., the difference between the threshold voltage or resistance when the memory element 220 is storing a logic state '0' versus a logic state '1') may correspond to the read window of the memory element 220.

The word line 210-*a* may be at a first level of the memory array 200, the bit line 215-*a* may be at a second level of the memory array 200, and the word line 210-*b* may be at a third level of the memory array 200. Each word line 210 and bit line 215 may include a respective metal portion 230 and a line of metal oxide 235. In some examples, the line of metal oxide 235 may alternatively be considered as separate from the corresponding access line (e.g., separate from the corresponding word line 110 or bit line 115), but the claims are not limited based on such conceptualizations. As discussed above and elsewhere herein, a layer of metal oxide may have been formed based on oxidizing a corresponding metal layer, and in some cases a lines of metal oxide 235 may comprise the same metal material as the metal portions 230 (e.g., if the metal portion 230 comprises tungsten (W), then the line of metal oxide 235 may comprise tungsten oxide ($W_xO_y$); if the metal portion 230 comprises aluminum (Al), then the line of metal oxide 235 may comprise aluminum oxide ($Al_xO_y$); and so on). As described below and elsewhere herein, a second metal layer may have been formed above (e.g., on) the layer of metal oxide corresponding to lines of metal oxide 235, and the metal portions 230 may have been formed from such a second metal layer. As discussed elsewhere herein, such structures and techniques may provide current spike mitigation and access line resistivity benefits, among other possible benefits.

Figure 3:
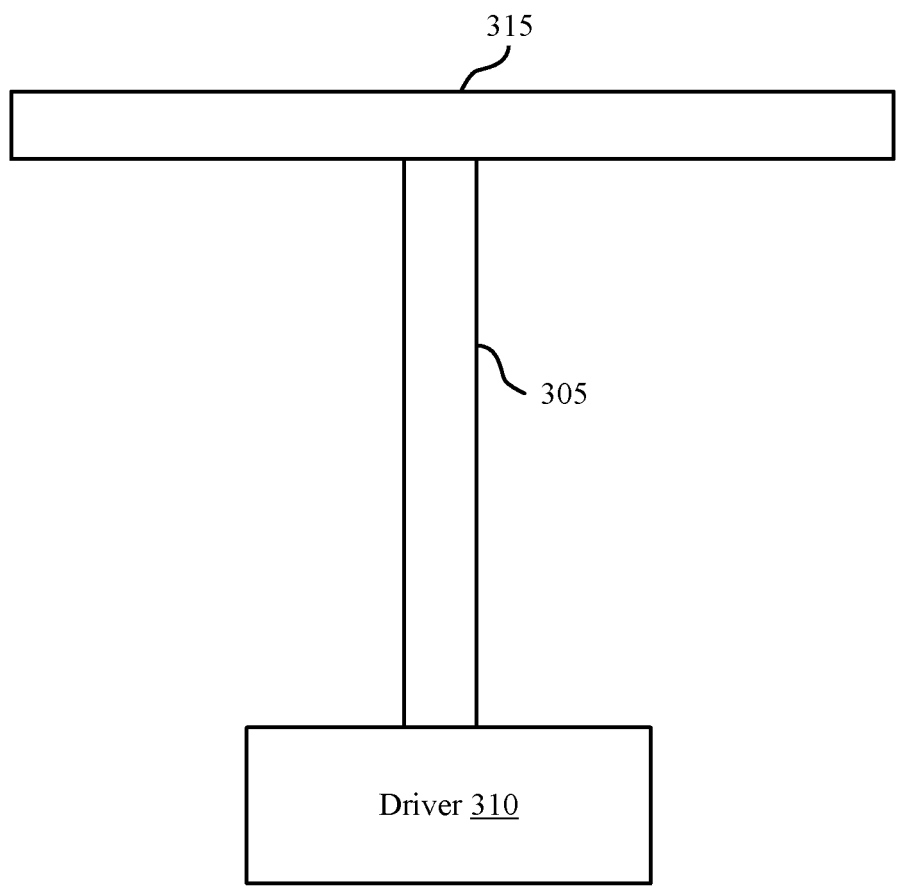
FIG. 3 illustrates an example of a memory structure that supports reduced resistivity for access lines in a memory array in accordance with examples as disclosed herein.

FIG. 3 illustrates an example of a memory structure 300 that supports reduced resistivity for access lines in a memory array. Memory structure 300 may correspond to an intermediate structure related to the fabrication of a memory device 100 as described with reference to FIG. 1 or a memory array 200 as described with reference to FIG. 2, for example. Memory structure 300 may include a via 305, driver 310, and a first metal layer 315.

Via 305 may be configure do carry signals between the driver 310 and an access line, which may be formed as described herein. Via 305 may extend through a stack of one or more materials (e.g., dielectric materials, memory cell materials, or any other materials included in a memory device), which are not shown in FIG. 3 for the sake of clarity in illustrating the shown features. The stack of one or more materials through which the via 305 extends may correspond in some cases to one or more decks of a memory device. Via 305 may be made of one or more materials. For example, via 305 may include a metal (e.g., tungsten (W), copper (Cu), aluminum (Al), gold (Au), titanium (Ti) or a metal alloy).

The driver 310 may be configured to drive a subsequently formed access line that is coupled with the via 305. For example, the driver 310 may drive an access line to a desired voltage as part of an access operation (e.g., a read, write, refresh operation as described with reference to FIG. 1). The driver 310 may include any quantity of transistors or other circuitry components to generate the desired voltage. The driver 310 may be an example of a word line driver or a bit line driver as described elsewhere herein.

Although a single via 305 and single driver 310 are shown, any quantity of vias 305 may be fabricated and may be coupled with any quantity of drivers 310. Additionally, although FIG. 3 illustrates the via 305 as coupled directly with the driver 310, the via 305 may alternatively be coupled with the driver 310 through quantity of intermediate interconnect structures (e.g., other vias, metal routing lines). Drivers 310 may also be distributed throughout an area under the memory array of the memory device.

In some cases, before the first metal layer 315 is formed, a thin layer of oxide (not shown) may form on the via 305 due to natural or unintentional oxidation—e.g., the via 305 may be exposed to oxygen during formation, which may cause a thin layer of oxide to form on top of the via 305. In some examples, before the first metal layer 315 is formed, the thin layer of oxide that forms on the via 305 may be removed using a dry etch process (e.g., a dry argon etch). That is, using the dry etch process may enable the first metal layer 315 to be in direct contact with the via 305.

The first metal layer 315 may be formed above (e.g., in contact with an upper surface of) the via 305 using any suitable technique. For example, the first metal layer 315 may be formed using a physical vapor deposition (PVD) process, a chemical vapor deposition (CVD) process, or any combination thereof. The first metal layer 315 may be formed as a thin layer or coating. In some cases, the first metal layer 315 may be formed as a lamellae. In some cases, the first metal layer 315 may be formed as a blanket layer above the via 305 and any number of other materials through which the via 305 may extend (e.g., the first metal layer 315 may be formed as a sheet, over the area of an entire die or wafer). In some cases, the first metal layer 315 may be formed from the same material as the via 305—e.g., from one of tungsten (W), copper (Cu), aluminum (Al), gold (Au), titanium (Ti) or a metal alloy. In other cases, the first metal layer 315 may be formed from a material different than the material used to form the via 305.

Figure 4:
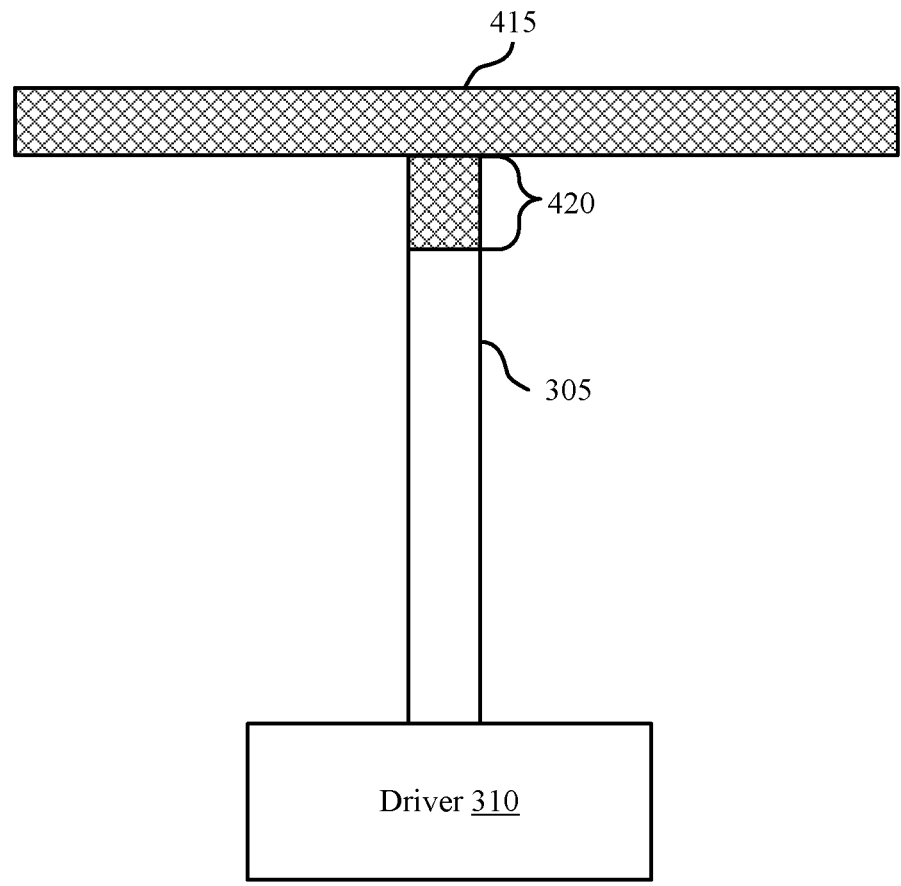
FIG. 4 illustrates an example of a memory structure that supports reduced resistivity for access lines in a memory array in accordance with examples as disclosed herein.

FIG. 4 illustrates an example of a memory structure 400 that supports reduced resistivity for access lines in a memory array. Memory structure 400 may correspond to an intermediate structure related to the fabrication of a memory device 100 as described with reference to FIG. 1 or a memory array 200 as described with reference to FIG. 2, for example. In some examples, the memory structure 400 may be the result of additional formation techniques applied to the memory structure 300 as described herein. Memory structure 300 may include a via 305, driver 310, and a metal oxide layer 415.

After forming the first metal layer 315 as described with reference to FIG. 3, the first metal layer 315 may be oxidized to form the metal oxide layer 415. For example, if the first metal layer 315 includes tungsten (W), the metal oxide layer 415 may include tungsten oxide ($W_xO_y$); if the first metal layer 315 includes aluminum (Al), the metal oxide layer 415 may include aluminum oxide ($Al_xO_y$); and so on.

In some examples, the first metal layer 315 may be oxidized by being exposed to oxygen at a relatively high temperature for a duration. Altering the duration for which or the temperature at which the first metal layer 315 is exposed to oxygen may alter the extent to which the first metal layer 315 is oxidized. For example, the greater the duration or temperature, the greater the extent of oxidation may be. When exposing the first metal layer 315 to oxygen, the oxygen may flow over the first metal layer 315.

In other examples, the first metal layer 315 may be oxidized by being exposed to an oxygenated plasma. In such cases, the metal oxide layer 415 may be formed by allowing the plasma to flow over the first metal layer 315. In some examples, the extent of oxidation of the metal oxide layer 415 may vary depending on the pressure used in the oxidation chamber, the excitation power of the oxygenated plasma, the concentration of the oxygenated plasma, and the temperature at which the first metal layer 315 is exposed to the oxygenated plasma.

In some examples, the first metal layer 315 may be formed in a deposition chamber, and the first metal layer 315 may be oxidized in an oxidation chamber. In some cases, the first metal layer 315 may be formed within a vacuum, and the vacuum may be maintained such that oxidation of the first metal layer may occur under a same vacuum (e.g., the first metal layer 315 may be formed and oxidized in situ).

In still other examples, the first metal layer 315 may be oxidized by being removed from the deposition chamber and being exposed to oxygen outside of a vacuum (e.g., ex situ). In such cases, the extent of oxidation of the metal oxide layer 415 may depend on the duration the first metal layer 315 is removed from the vacuum.

In some instances, a portion 420 (e.g., an upper portion) of the via 305 may also be oxidized during the oxidation process. For example, regardless of the technique used to oxidize the first metal layer 315, if oxidation is allowed to occur to a sufficient extent (e.g., such that an entire depth of the first metal layer 315 is oxidized, at least above the via 305), the portion 420 of the via 305 may also become oxidized (e.g., as a result of the same process used to oxidize the first metal layer). Thus, as one example, if the via 420 is formed from tungsten (W), the oxidation process may cause the portion 420 to include tungsten oxide ($W_xO_y$).

Figure 5:
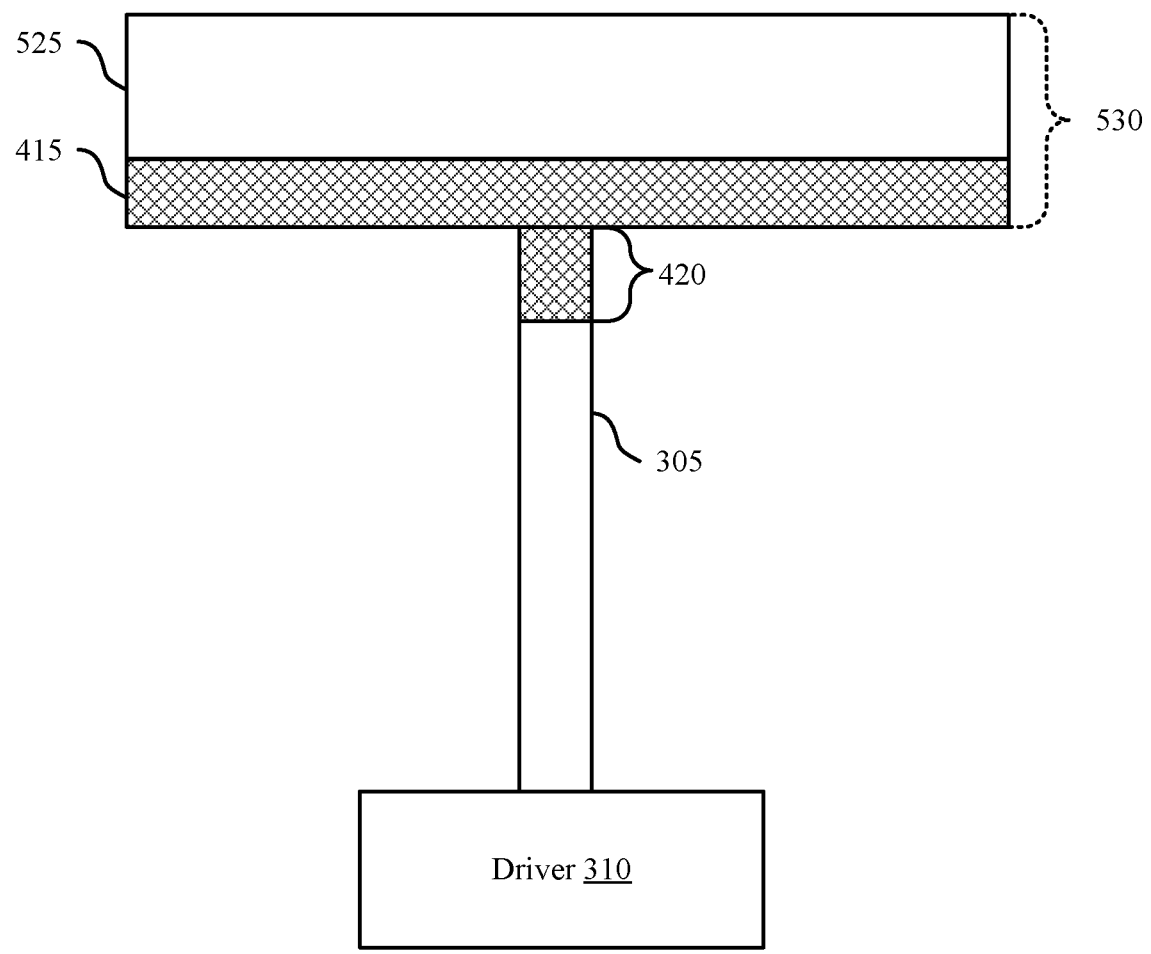
FIG. 5 illustrates an example of a memory structure that supports reduced resistivity for access lines in a memory array in accordance with examples as disclosed herein.

FIG. 5 illustrates an example of a memory structure 500 that supports reduced resistivity for access lines in a memory array. Memory structure 500 may correspond to an intermediate structure related to the fabrication of a memory device 100 as described with reference to FIG. 1 or a memory array 200 as described with reference to FIG. 2, for example. In some examples, the memory structure 500 may be the result of additional formation techniques applied to the memory structure 400 as described herein. Memory structure 300 may include a via 305, driver 310, a metal oxide layer 415, and a second metal layer 525.

After the oxidation process described with reference to FIG. 4 (e.g., the formation of the metal oxide layer 415), a second metal layer 525 may be formed on the metal oxide layer 415. The second metal layer 525 may be relatively thick relative to the first metal layer 315. In some examples, the second metal layer 525 may be formed from the same material as the first metal layer 315—e.g., from one of tungsten (W), copper (Cu), aluminum (Al), gold (Au), titanium (Ti) or a metal alloy. In other examples, the second metal layer 525 may be formed from a material different than the material of the first metal layer 315.

The second metal layer 525 may be formed using any suitable technique. For example, the second metal layer 525 may be formed using PVD process, a CVD process, or any combination thereof. In some cases, the second metal layer 525 may be formed using the same deposition process used to form the first metal layer 315. In other examples, the second metal layer 525 may be formed using a deposition process different than the one used to form the first metal layer 315. In some cases, the second metal layer 525 may be formed as a blanket layer above the first metal layer 315 (e.g., the second metal layer 525 may be formed as a sheet, over the area of an entire die or wafer).

In some examples, the second metal layer 525 may be formed in a same vacuum in which the first metal layer 315 is formed and oxidized (e.g., formation of the first metal layer 315, oxidation of the first metal layer 315, and formation of the second metal layer 525, or any subset thereof, may occur in situ). This may prevent the metal oxide layer 415 from being exposed to any air before formation of the second metal layer 525.

The second metal layer 525 and the metal oxide layer 415 may be patterned (e.g., processed) to form any quantity of access lines 530. At least one of the access lines 530 may be coupled with the via 305, as shown in FIG. 5. This may result in lines of metal and lines of metal oxide respectively formed form the second metal layer 525 and the metal oxide layer 415. For a given access line 530, the corresponding line of metal oxide may be considered part of (e.g., a sublayer of) the access line 530 or alternatively may be considered a layer separate from (e.g., in contact with) the access line 530. Neither conceptualization is limiting on the claims.

The driver 310 may be configured to drive the access line 530, through a signal path that includes the via 305, during access operations (e.g., read and write operations) to select a memory cell coupled with the access line 530.

In some cases, forming the second metal layer 525 on top of the metal oxide layer 415 may cause the second metal layer 525 (and thus any access line 530 formed therefrom) to have a lower resistivity than if the metal oxide layer 415 were not present (e.g., if the second metal layer 525 was formed directly on the via 305 and one or more materials surrounding the via 305). For example, when the second metal layer 525 is formed on the metal oxide layer 415, the second metal layer 525 may form on nucleation points of the metal oxide layer 415. Forming on the nucleation points of the metal oxide layer 415 may cause larger crystals (e.g., grains) of the second metal layer 525 material to form during the formation process of the second metal layer 525. In some examples, larger crystals may cause the second metal layer 525 to have a reduced density, reduced resistivity, or both.

As the second metal layer 525 may have a reduced resistivity (e.g., as compared with being formed in the absence of the layer of metal oxide 415), the amount of drive current needed to access far memory cells via the access line 530 may be reduced. That is, the relatively large ED of the far memory cells may be mitigated by a reduced resistivity on the current path between the far memory cells and the driver 310. Further, differences in ED between near and far memory cells may be reduced, supporting further design optimizations (e.g., configuration of drive currents output by the driver 310).

Additionally or alternatively, the presence of a line of metal oxide formed from the metal oxide layer 415, the oxidized portion 420 of the via 305, or both, may mitigate current spikes through memory cells coupled with an access line 530. This may prevent memory cell degradation and extend memory cell lifetime.

In some examples, during the formation process as described with reference to FIG. 4, the first metal layer 315 may be partially oxidized. That is, the first metal layer 315 may be oxidized for a duration shorter than a duration utilized to fully oxidize the first metal layer 315 as described with reference to FIG. 4. In such examples, the portion 420 (e.g., the upper portion) of the via 305 may avoid the oxidation process and remain unoxidized. For example, if the via 305 is formed from tungsten (W), the portion 420 may also remain as tungsten rather than being oxidized to include tungsten oxide ($W_xO_y$) following the partial oxidation of first metal layer 315. Thus, the first metal layer 315 may be formed into a layer comprising both a metal layer and a metal oxide layer (e.g., a layer with an upper portion including the metal oxide layer 415 and a lower portion including the metal layer 315). In such examples, the second metal layer 525 may still be formed over the metal oxide layer 415. That is, the formation process may result in a via 305, the first metal layer 315 formed on top of the via 305, the upper portion of the first metal layer 315 being oxidized to the metal oxide layer 415, and the second metal layer 525 formed on top of the metal oxide layer 415. In some examples, the presence of the metal oxide layer 415 between the metal layer 315 and the second metal layer 525 may mitigate current spikes coupled with the access line 530.

Figure 6:
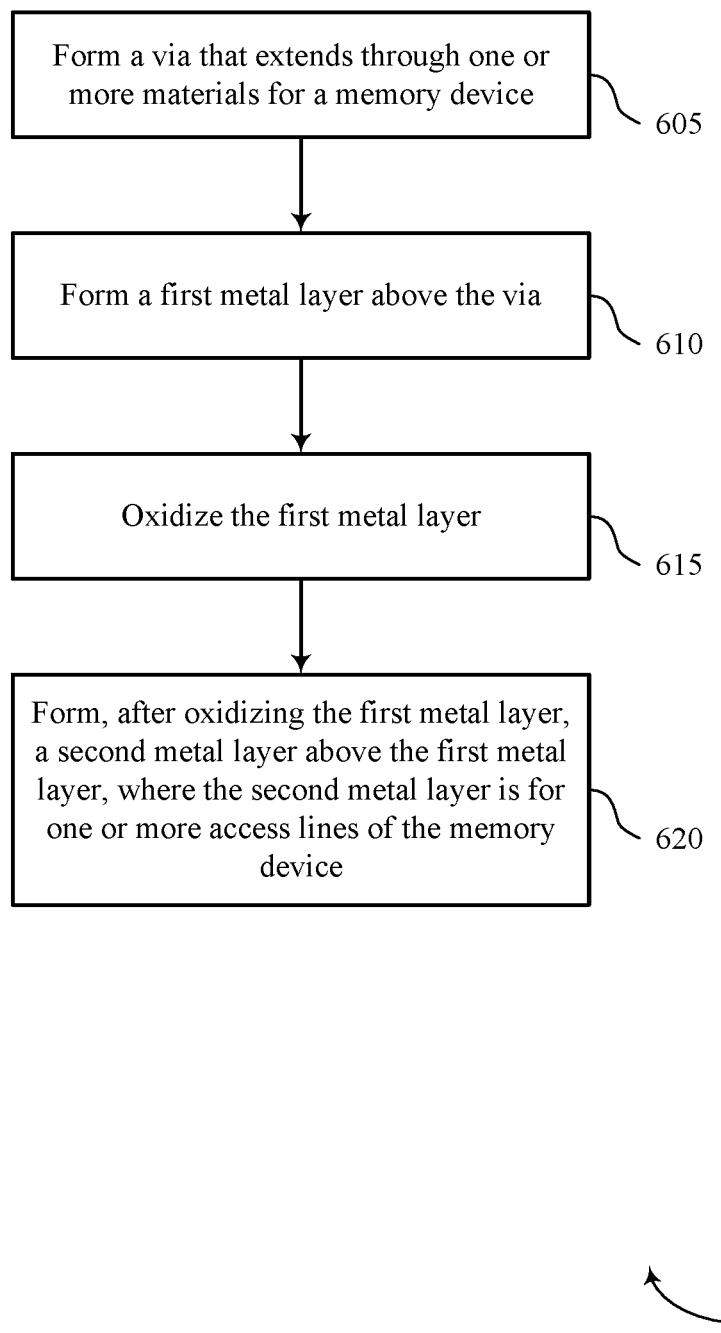
FIGS. 6 and 7 show flowcharts illustrating a method or methods that support reduced resistivity for access lines in a memory array in accordance with examples as disclosed herein.

FIG. 6 shows a flowchart illustrating a method or methods 600 that supports reduced resistivity for access lines in a memory array in accordance with aspects of the present disclosure. The operations of method 600 may be implemented by a formation tool, an oxidation tool, a dry etch tool, or any combination thereof as described herein.

At 605, a via that extends through one or more materials for a memory device may be formed. The operations of 605 may be performed according to the methods described herein. In some examples, aspects of the operations of 605 may be performed by a formation tool as described herein.

At 610, a first metal layer may be formed above the via. The operations of 610 may be performed according to the methods described herein. In some examples, aspects of the operations of 610 may be performed by a formation tool as described herein.

At 615, the first metal layer may be oxidized. The operations of 615 may be performed according to the methods described herein. In some examples, aspects of the operations of 615 may be performed by an oxidation tool as described herein.

At 620, after oxidizing the first metal layer, a second metal layer may be formed above the first metal layer, where the second metal layer is for one or more access lines of the memory device. The operations of 620 may be performed according to the methods described herein. In some examples, aspects of the operations of 620 may be performed by a formation tool as described herein.

In some examples, an apparatus as described herein may perform a method or methods, such as the method 600. The apparatus may include features or means for forming a via that extends through one or more materials for a memory device, forming a first metal layer above the via, oxidizing the first metal layer, and forming, after oxidizing the first metal layer, a second metal layer above the first metal layer, where the second metal layer is for one or more access lines of the memory device.

Some examples of the method 600 and the apparatus described herein may further include operations, features, means, or instructions for oxidizing an upper portion of the via after forming the first metal layer above the via.

In some instances of the method 600 and the apparatus described herein, the upper portion of the via may be oxidized based on exposing the first metal layer to oxygen while the upper portion of the via may be in contact with the first metal layer.

In some cases of the method 600 and the apparatus described herein, the first metal layer may have a first thickness, and the second metal layer may have a second thickness that may be greater than the first thickness.

In some examples of the method 600 and the apparatus described herein, the first metal layer and the second metal layer may be both formed using a same material.

In some instances of the method 600 and the apparatus described herein, the via may be in contact with the first metal layer, and the first metal layer may be in contact with the second metal layer.

In some cases of the method 600 and the apparatus described herein, the first metal layer may be for the one or more access lines of the memory device.

In some examples of the method 600 and the apparatus described herein, oxidizing the first metal layer may include operations, features, means, or instructions for exposing the first metal layer to oxygen for a duration.

In some instances of the method 600 and the apparatus described herein, oxidizing the first metal layer may include operations, features, means, or instructions for exposing the first metal layer to a plasma that.

In some cases of the method 600 and the apparatus described herein, forming the first metal layer may include operations, features, means, or instructions for depositing the first metal layer via a physical vapor deposition (PVD) process, a chemical vapor deposition (CVD) process, or any combination thereof.

In some examples of the method 600 and the apparatus described herein, forming the second metal layer may include operations, features, means, or instructions for depositing the second metal layer via a physical vapor deposition (PVD) process, a chemical vapor deposition (CVD) process, or any combination thereof.

Some instances of the method 600 and the apparatus described herein may further include operations, features, means, or instructions for removing an oxidized portion of the via before forming the first metal layer.

Some cases of the method 600 and the apparatus described herein may further include operations, features, means, or instructions for forming the first metal layer occurs in a vacuum, oxidizing the first metal layer occurs in the vacuum, and forming the second metal layer occurs in the vacuum.

Figure 7:
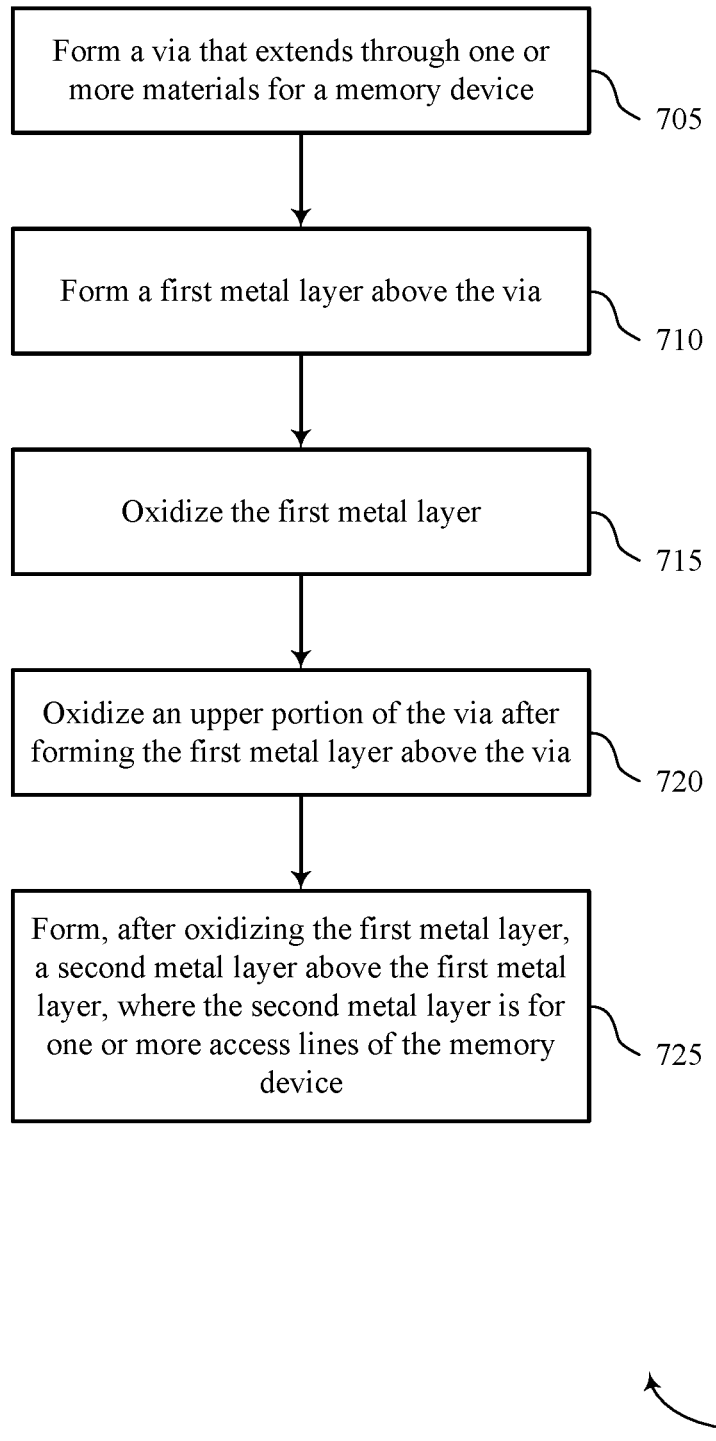

FIG. 7 shows a flowchart illustrating a method or methods 700 that supports reduced resistivity for access lines in a memory array in accordance with aspects of the present disclosure. The operations of method 700 may be implemented by a formation tool, an oxidation tool, a dry etch tool, or any combination thereof as described herein.

At 705, the a via that extends through one or more materials for a memory device may be formed. The operations of 705 may be performed according to the methods described herein. In some examples, aspects of the operations of 705 may be performed by a formation tool as described herein.

At 710, a first metal layer may be formed above the via. The operations of 710 may be performed according to the methods described herein. In some examples, aspects of the operations of 710 may be performed by a formation tool as described herein.

At 715, the first metal layer may be oxidized. The operations of 715 may be performed according to the methods described herein. In some examples, aspects of the operations of 715 may be performed by an oxidation tool as described herein.

At 720 an upper portion of the via may be oxidized after forming the first metal layer above the via. The operations of 720 may be performed according to the methods described herein. In some examples, aspects of the operations of 720 may be performed by an oxidation tool as described with herein.

At 725, after oxidizing the first metal layer, a second metal layer may be formed above the first metal layer, where the second metal layer is for one or more access lines of the memory device. The operations of 725 may be performed according to the methods described herein. In some examples, aspects of the operations of 725 may be performed by a formation tool as described herein.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a set of memory cells coupled with an access line that extends in a first direction within the apparatus, the access line including a metal, a via that extends in a second direction through one or more materials within the apparatus, the second direction different than the first direction, and a line of metal oxide extending in the first direction between the metal and the via.

In some examples, a portion of the via may be oxidized and in contact with the line of metal oxide.

In some cases, the line of metal oxide may have a first thickness, and the metal of the access line may have a second thickness that may be greater than the first thickness.

In some instances, the line of metal oxide may be in contact with the metal of the access line.

In some examples, the access line includes the line of metal oxide.

In some cases, a first portion of the via includes the metal, and a second portion of the via include the metal oxide.

In some instances, the access line and the first portion of the via include tungsten, and the line of metal oxide and the second portion of the via include tungsten oxide.

In some examples, the line of metal oxide includes an oxide of a second metal that may be different than the metal of the access line.

In some cases, the line of metal oxide may have a greater resistivity than the via, the metal of the access line, or both.

An apparatus is described. The apparatus may include an access line for a set of memory cells, where the access line includes a metal line that extends in a first direction within the apparatus, a via that extends in a second direction that is different than the first direction, and a driver for the access line, where the driver is coupled with the access line through the via and a metal oxide is interposed between the metal line and the via.

Some examples may further include at least a portion of the metal oxide may be included within a line of metal oxide that extends in the first direction.

In some cases, a portion of the via includes the metal oxide and may be in contact with the line of metal oxide.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a set of memory cells coupled with an access line that extends in a first direction within the apparatus, the access line comprising a metal;
   a via that extends in a second direction different than the first direction through one or more materials within the apparatus and that is coupled with a line of metal oxide, wherein a first portion of the via comprises tungsten and a second portion of the via comprises tungsten oxide; and
   the line of metal oxide comprising tungsten oxide and extending in the first direction between the metal and the via.

2. The apparatus of claim 1, wherein the second portion of the via is in contact with the line of metal oxide.

3. The apparatus of claim 1, wherein:
   the line of metal oxide has a first thickness; and
   the metal of the access line has a second thickness that is greater than the first thickness.

4. The apparatus of claim 1, wherein the line of metal oxide is in contact with the metal of the access line.

5. The apparatus of claim 1, wherein the access line further comprises the line of metal oxide.

6. The apparatus of claim 1, wherein the metal of the access line is different than the tungsten oxide of the line of metal oxide.

7. The apparatus of claim 1, wherein the line of metal oxide has a greater resistivity than the via, the metal of the access line, or both.

8. An apparatus, comprising:
   an access line for a set of memory cells, wherein the access line comprises a metal line that extends in a first direction within the apparatus;
   a via that extends in a second direction that is different than the first direction and that is coupled with a metal oxide layer, wherein a first portion of the via comprises tungsten and a second portion of the via comprises tungsten oxide; and
   a driver for the access line, wherein:
   the driver is coupled with the access line through the via; and
   the metal oxide layer comprising tungsten oxide and interposed between the metal line and the via.

9. The apparatus of claim 8, wherein at least a portion of the metal oxide layer is included within a line of metal oxide that extends in the first direction.

10. The apparatus of claim 9, wherein a portion of the via comprises the metal oxide layer and is in contact with the line of metal oxide.

* * * * *